(12) United States Patent
Stirling et al.

(10) Patent No.: US 9,003,266 B1
(45) Date of Patent: *Apr. 7, 2015

(54) PIPELINED TURBO CONVOLUTION CODE DECODER

(75) Inventors: Colin Stirling, Edinburgh (GB); David I. Lawrie, Lauder (GB); David Andrews, Falkirk (GB)

(73) Assignee: Xilinx, Inc., San Jose, CA (US)

( * ) Notice: Subject to any disclaimer, the term of this patent is extended or adjusted under 35 U.S.C. 154(b) by 643 days.

This patent is subject to a terminal disclaimer.

(21) Appl. No.: 13/088,303

(22) Filed: Apr. 15, 2011

(51) Int. Cl.
  *H03M 13/00* (2006.01)
  *H03M 13/15* (2006.01)
(52) U.S. Cl.
  CPC .................................. *H03M 13/1555* (2013.01)
(58) Field of Classification Search
  USPC .......................................................... 714/774
  See application file for complete search history.

(56) References Cited

U.S. PATENT DOCUMENTS

| | | | |
|---|---|---|---|
| 7,100,101 B1 | 8/2006 | Hemphill et al. | |
| 7,266,757 B1 * | 9/2007 | Mazahreh et al. | ............ 714/794 |
| 7,810,010 B1 | 10/2010 | Lawrie | |
| 8,332,735 B1 | 12/2012 | Andrews et al. | |
| 2002/0021763 A1 * | 2/2002 | Le Dantec | ..................... 375/295 |
| 2002/0124227 A1 * | 9/2002 | Nguyen | ....................... 714/786 |
| 2004/0153942 A1 * | 8/2004 | Shtutman et al. | ............. 714/755 |
| 2004/0210812 A1 * | 10/2004 | Cameron et al. | .............. 714/746 |
| 2005/0273687 A1 * | 12/2005 | Park et al. | ...................... 714/752 |
| 2008/0043878 A1 * | 2/2008 | Cameron et al. | ............. 375/295 |
| 2011/0161782 A1 * | 6/2011 | Engin | ........................... 714/763 |
| 2012/0106683 A1 * | 5/2012 | Zhao | ............................ 375/341 |

OTHER PUBLICATIONS

Author: S. M. Karim and Indrajit Chakrabarti; Title: Design of Pipelined Parallel Turbo Decoder Using Contention Free Interleaver; Date: 2011; Publisher: IEEE, 978-1-4577-0255-6/11.*

* cited by examiner

*Primary Examiner* — April Y Blair
*Assistant Examiner* — Thien D Nguyen
(74) *Attorney, Agent, or Firm* — LeRoy D. Maunu

(57) ABSTRACT

In one embodiment, a method of block decoding is provided. For each of a plurality of data blocks input to a memory arrangement, a plurality of decoding iterations are performed using a circular pipeline of processing stages. For each decoding iteration, one processing stage of the circular pipeline performs a first set and a second set of soft-input-soft-output (SISO) decoding operations on a block of data. The first set of SISO decoding operations produces an intermediate block of data. The second set of SISO decoding operations is performed on the intermediate data block to complete the one decoding iteration. The next decoding iteration of the plurality of decoding iterations is performed using the next processing stage following the one processing stage of the circular pipeline of processing stages.

20 Claims, 9 Drawing Sheets

PIPELINED TURBO CONVOLUTION CODE DECODER

FIELD OF THE INVENTION

One or more embodiments generally relate to data processing, and more particularly to iterative block-based data processing.

BACKGROUND

Evolved High-Speed Packet Access (HSPA+) is a wireless standard defined in 3GPP release 7. This standard is set for wide adoption across existing infrastructure currently based on High Speed Download Packet Access (HSDPA) to offer users extended bandwidth prior to the rollout of 3GPP Long Term Evolution (LTE). The HSPA+ standard potentially increases bandwidth more than 10-fold, from 14.4 Mbits/s up to 168 Mbits/s, which will significantly increase the associated processing burdens within the system. This burden is most prevalent in Turbo Convolution Code (TCC) decoders, which are one of the most computationally intensive aspects of the HSPA+ system.

LTE uses a specially designed contention-free interleaver. This allows a large block of data to be partitioned into smaller segments, which can be processed in parallel without multiple processing units contending for access to the same data segment. In contrast, processing algorithms such as TCC decoding for the 3GPP HSPA+ standard do not provide a contention-free interleaver. Dividing data blocks across multiple processing units is extremely difficult because multiple processing units may require access to data from the same memory at the same time creating contention. As a result, it is difficult to implement TCC using a parallel architecture.

In algorithms such as the Turbo Convolution Code (TCC) decoding, the burden placed on the processing unit (PU) is great in terms of computational intensity and resource requirements. In order to produce an efficient solution, the throughput of the processing unit must be maximized, and therefore, utilization of the processing unit should be as near to 100% as possible. These algorithms process each block for a certain number of iterations, typically in the range of 5 to 7 iterations. Each iteration consists of two half-iterations, which are referred to as SISOs (Soft-Input Soft-Output). One of the half-iterations performs SISO operations in an interleaved order while the other half iteration performs SISO operations in a non-interleaved order. While the half-iterations may be performed in either order, for ease of explanation, the examples and embodiments are primarily described herein with reference to an iteration in which interleaved SISO operations are performed followed by non-interleaved SISO operations.

At the end of each SISO, there will be a significant number of clock cycles required to empty pipelines and finish write back of the so-called extrinsic data, which is exchanged between consecutive SISO operations. The next SISO operation is therefore unable to start until the write back of the extrinsic data has completed. The extrinsic data from the preceding SISO is combined with the original input data for the next SISO operation.

Consequently, if one processing unit is used to perform consecutive SISO operations of a data-block, there will be a delay. As a result, the processing unit will not be utilized in this time period. For example, FIG. 1 illustrates latency incurred in processing successive SISO operations on a data block by the same processing unit. The idle cycles 130 (shown with hatched lines) are incurred between each SISO operation of data block B1 during write back of extrinsic data. In order to fully utilize a processing unit, two data blocks, which can be iteratively processed in turn, are required to avoid the delay incurred during write back. FIG. 2 illustrates alternating processing of two data blocks B1 and B2 on a processing unit for two decoding iterations (four SISO operations). After SISO processing of data block B1 by the processing unit is completed, extrinsic data must be written back to memory. During the write back time period, because data block B2 is not dependent on the extrinsic data of data block B1, the processing unit can begin a SISO operation of data block B2. In this manner, the idle processing time 130 depicted in FIG. 1 can be avoided and throughput can be increased.

To accelerate block-based processing algorithms, such as TCC decoding, a plurality of the processing units may be used to process data blocks in parallel. One possible architecture avoids idle cycles, as shown in FIG. 2, by buffering two blocks for each one of the plurality of processing units. However, this architecture does not scale well by adding processing units because the overall storage requirement is equal to 2 times the maximum block size for each processing unit in the system.

The memory requirement is further increased because an input buffer must be capable of supplying multiple blocks to all processing units in parallel. This situation may occur when processing of data blocks simultaneously completes on all processing units. Because the size of blocks typically varies from 40 to 5114 bits in HSPA+, this solution may result in large discrepancies in the processing time required. For example, where two smaller blocks are being processed alternately on a processing unit, each processing stage will be completed in far less time than where two large blocks are being processed. As demands on throughput for solutions to algorithms such as TCC decoding for the 3GPP HSPA+ standard extend to 100-200 Mbps, such solutions are impractical as the number of processing units required will typically be in the range of 4-8, creating memory demands that are impractical in most platforms/devices.

SUMMARY

In one embodiment, a method of block decoding is provided. A plurality of data blocks are input into a memory arrangement. For each of the plurality of data blocks in the memory arrangement, a plurality of decoding iterations are performed using a circular pipeline of processing stages. For each decoding iteration, one processing stage of the circular pipeline performs a first set and a second set of soft-input-soft-output (SISO) decoding operations on a block of data. One of the first and second sets of SISO decoding operations performs decoding operations on interleaved data and the other performs decoding operations on non-interleaved data. The first set of SISO decoding operations is performed on a block of data from the plurality of data blocks in the memory arrangement and produces an intermediate block of data. The second set of SISO decoding operations is performed on the intermediate data block to complete the one decoding iteration. The next decoding iteration of the plurality of decoding iterations is performed using the next processing stage following the one processing stage of the circular pipeline of processing stages.

In another embodiment a decoder is provided. The decoder includes a memory arrangement configured for storage of a plurality of data blocks and a circular pipeline of processing stages. Each processing stage includes a first processing unit and a second processing unit. The first processing unit is coupled to the memory arrangement and is configured to perform a first set of soft-input-soft-output (SISO) decoding operations on a block of data from the plurality of data blocks in the memory arrangement to produce an intermediate block of data, and store the intermediate block of data in the memory arrangement. The second processing unit is coupled to the memory arrangement and is configured to perform a second set of SISO decoding operations using the intermediate block of data to complete one decoding iteration. Each second processing unit in the processing stage is configured to output a decoded data block in response to completing a final processing iteration, and otherwise, store a partially decoded data block in the memory arrangement. Each first processing unit in the processing stage is configured to process a new block of data from the plurality of data blocks in the memory arrangement in response to a partially decoded data block from the second processing unit of the preceding processing stage in the circular pipeline not being available.

In yet another embodiment, a system for iterative processing if provided. The system includes a memory arrangement configured for storage of a plurality of data blocks, and a plurality of processing stages. The plurality of processing stages are configured to operate in a circular pipeline of identical processing stages, each processing stage being configured to perform one decoding iteration. Each processing stage is configured to output a fully processed data block in response to completing a final processing iteration, and otherwise, store a partially processed data block in the memory arrangement. The processing stage is further configured to receive and process an unprocessed one of the plurality of data blocks in response to the partially processed data block not being available, and otherwise, receive and process a partially processed data block from the second processing unit of the preceding processing stage in the circular pipeline.

It will be appreciated that various other embodiments are set forth in the Detailed Description and Claims, which follow.

BRIEF DESCRIPTION OF THE DRAWINGS

Various aspects and advantages of the embodiments will become apparent upon review of the following detailed description and upon reference to the drawings in which.

DETAILED DESCRIPTION OF THE DRAWINGS

One or more embodiments implement high-throughput parallel processing with reduced memory requirements by performing consecutive half iterations of each data block on different processing units in a pipeline fashion, rather than performing all iterations of a data block on the same processing unit. Using this architecture, a data block does not need to be physically divided for TCC decoding, which allows use of either contention free or non-contention free interleavers while avoiding idle processing cycles.

While the embodiments may be applicable to a number of block based processing algorithms, for ease of explanation, the embodiments and examples herein are described primarily with reference to the TCC decoding for HSPA+. The processing units are configured and arranged in a circular pipeline, where the first SISO operation on a data block will start at a specific processing unit in the pipeline, and ensuing SISO operations on the block are performed on downstream processing units in the pipeline. Once all SISO operations are completed, the block will exit the circular pipeline from the processing unit that completes the final SISO operation.

Figure 1:
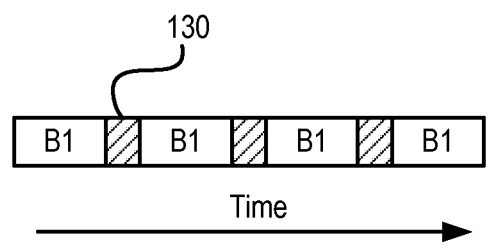
FIG. 1 illustrates latency incurred in processing successive decoding SISOs or half iterations of a data block on the same processing unit.
Figure 2:
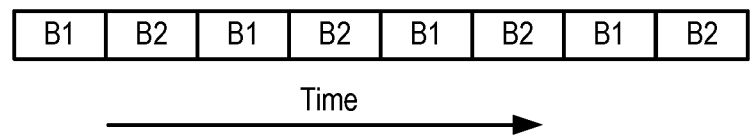
FIG. 2 illustrates alternating processing of two data blocks, B1 and B2, on a processing unit for two decoding iterations.
Figure 3:
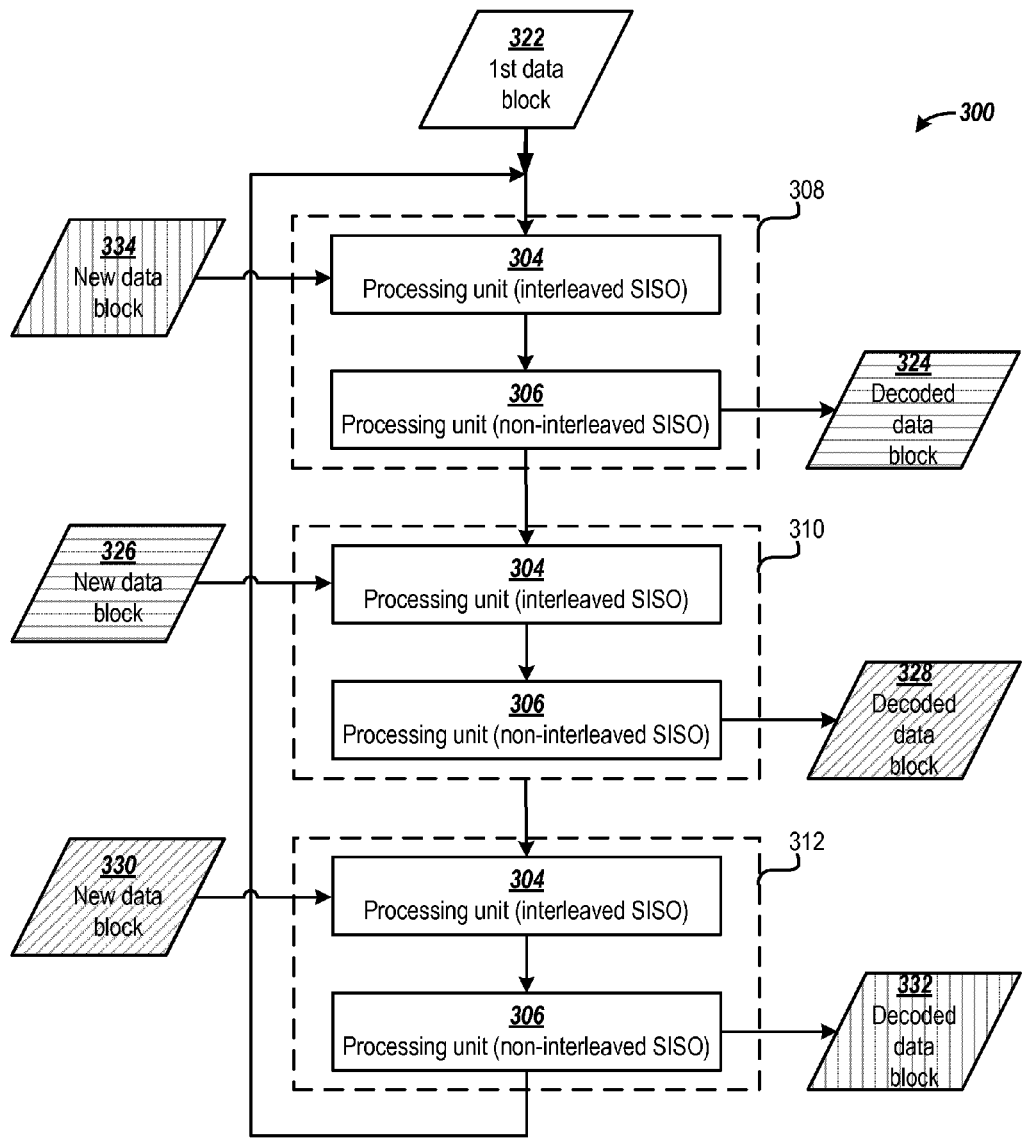
FIG. 3 illustrates data flow in an example circular pipeline configured for parallel processing of block data.

FIG. 3 illustrates the data flow in an example circular pipeline configured for parallel processing of block data. The circular pipeline 300 includes three processing stages 308, 310, and 312. Each processing stage includes two processing units 304 and 306 for performing SISO operations. A first data block 322 is input to processing stage 308, which performs a first decoding iteration on the data block. For each subsequent decoding iteration, the partially decoded data block is input to and processed by the next process stage in the pipeline. For example, the second decoding iteration of data block 322 would be performed by processing stage 310, the third decoding iteration would be performed by processing stage 312, the fourth decoding iteration would be performed by processing stage 308, and so on, until decoding is completed.

When decoding is completed by a processing unit, a new data block may be input to the next processing stage in the pipeline. For example, if decoding is completed by processing unit 306 of stage 308, the decoded data block 324 may be output, and new data block 326 may be input to processing unit 304 in processing stage 310. Similarly, if decoding is completed in processing stage 310, decoded data block 328 is output and new data block 330 is input to processing unit 304 in processing stage 312. Data block 332 shows the completion of decoding by processing unit 306, and new data block 334 can be input to processing unit 304 for processing.

Processing units may be implemented differently for different applications and may exhibit different latency and throughput performance. In many implementations, each processing unit may be implemented in a pipelined manner—allowing processing of a data block to begin before processing of a previous data block by the processing unit has completed. In such an implementation, the throughput of a processing unit, in data blocks/unit time, is dictated by the processing rate (x data samples/unit time) of the processing unit and the number of samples included in each data block. For ease of explanation, the data block input time is used herein to refer to the minimum number of cycles required to input the entire data block to the processing unit. The latency between a sample of a data block being input and the corresponding processed sample being output is referred to as the pipeline delay.

It is recognized that the pipelined nature of the processing unit does not prevent continuous input of blocks without any delay between them. Because successive decoding iterations are performed using different processing stages, a processing unit need only have had the data block input for processing in its entirety before the next data block can be input. The processing unit need not wait to have completed writeback or completed SISO processing of the data block before initiating processing of the next block.

Figure 4:
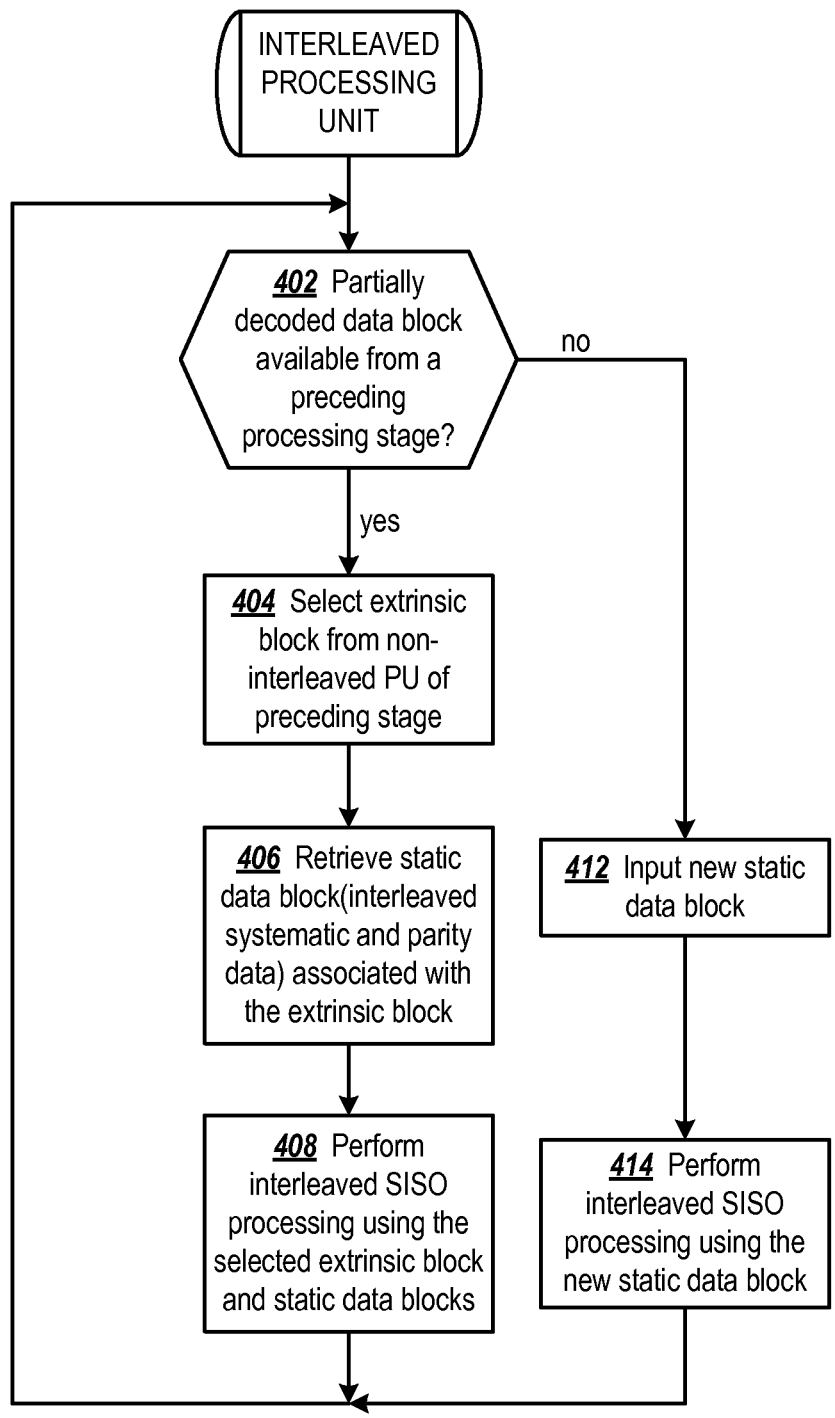
FIG. 4 shows a flowchart of the general process performed by an example interleaved SISO processing unit.

FIG. 4 shows a flowchart of the general process performed by an example interleaved SISO processing unit. If a partially decoded data block is unavailable from a preceding processing stage in the circular pipeline at decision block 402, a new data block is input to the interleaved processing unit at block 412. Interleaved SISO operations are performed using the new data at block 414. Otherwise, the extrinsic data block from the non-interleaved processing unit of the preceding stage is selected as input at block 404 for processing. Static data block sets associated with the extrinsic block are retrieved from memory at block 406. Interleaved SISO operations are performed using the selected extrinsic and static data at block 408.

Figure 5:
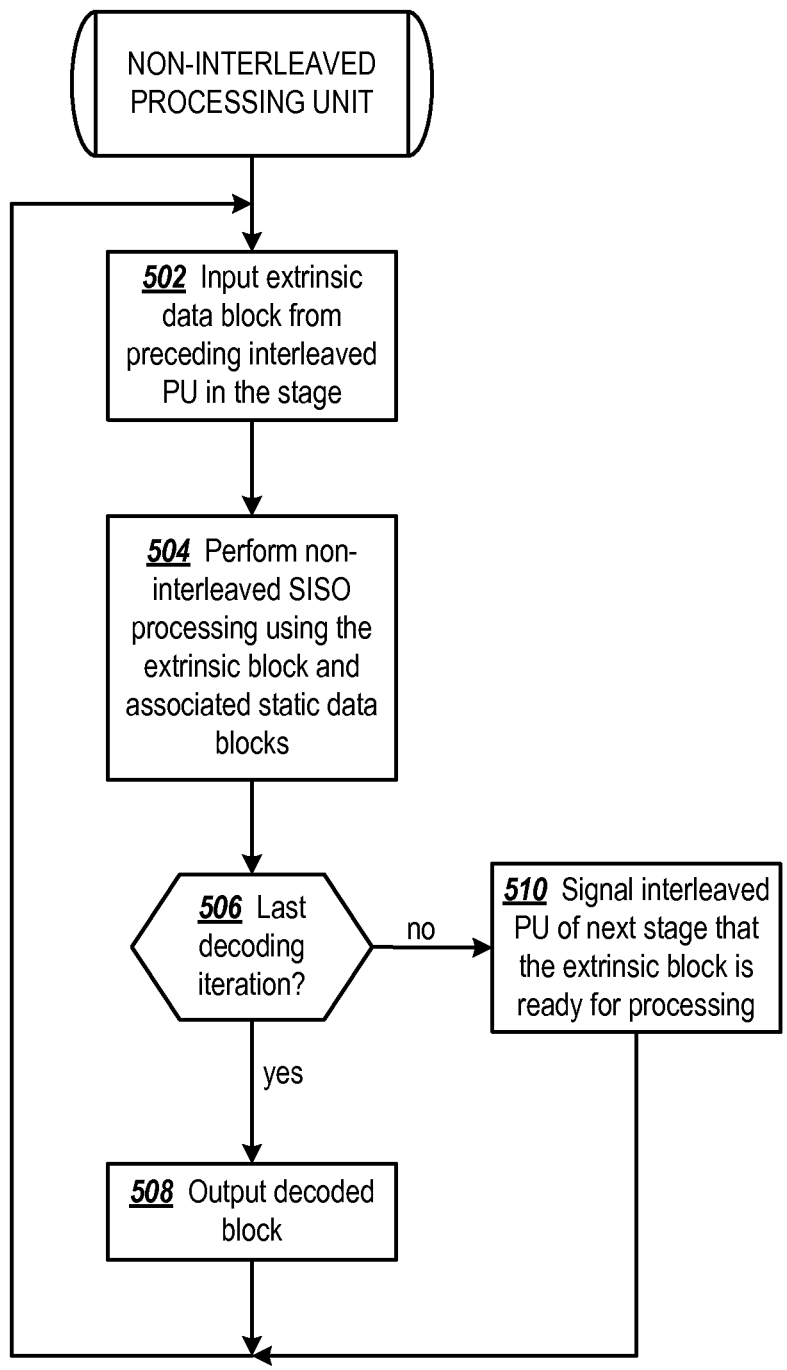
FIG. 5 shows a flowchart of the general process performed by an example non-interleaved SISO processing unit.

FIG. 5 shows a flowchart of the general process performed by an example non-interleaved SISO processing unit. Extrinsic data produced by the preceding interleaved processing unit in the process stage are input at block 502. A non-interleaved SISO operation is performed using the extrinsic data block and associated static data block at processing step 504. If the SISO operation completes decoding of the data block at decision step 506, the decoded data block is output at step 508. Otherwise, the interleaved processing unit of the next processing stage is signalled at step 510 to indicate that the extrinsic data block is ready for another decoding iteration.

The dataflow shown in FIGS. 4 and 5 illustrate an implementation in which the interleaved SISO operation is performed first followed by the non-interleaved SISO operation. It is recognized that a processing stage may alternatively be configured to perform the non-interleaved SISO operation followed by the interleaved SISO operation.

Figure 6:
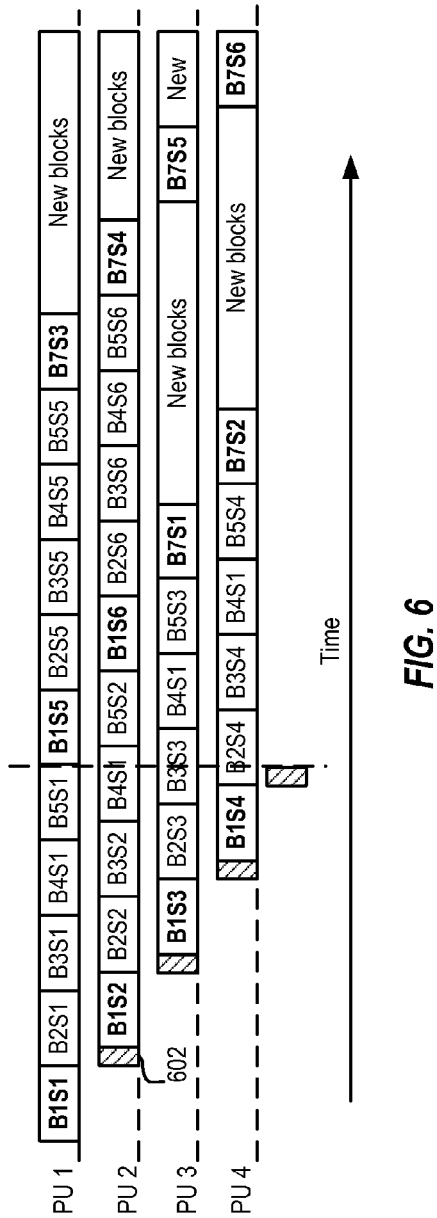
FIG. 6 illustrates an example data flow in a system having four processing units arranged in a circular pipeline.

FIG. 6 illustrates data flow in an example system having four processing units arranged in a circular pipeline. In this example, each data block is processed in three decoding iterations (i.e., six SISO operations). The data block input time is approximately 4 times the pipeline delay incurred by each processing unit. The pipeline delay is represented as hatched blocks, for example, block 602. A total of 3 iterations (6 SISO operations) are completed as represented by labels B1S1 through B1S6 for data block B1. After each SISO operation, data block B1 is available to the next processing unit in the circular pipeline for continued decoding. After processing by processing unit PU4 in the pipeline, a partially decoded data block is provided to processing unit PU1 for continued decoding.

Pipeline delay 602 is incurred in performing write back between successive SISO operations of data block B1. However, following initial latency in each processing unit, the processing unit can begin processing the next data block in the pipeline during the write back period. The later blocks labelled B2 to B7 do not incur any idle cycles at all. For ease of explanation, FIG. 6 illustrates decoding completing in a total of three iterations. However, it is recognized that decoding of each block may be completed over any number of iterations.

The circular pipeline effectively eliminates idle cycles incurred by the processing units by continuously replacing blocks that have completed the final decoding iteration (retiring blocks) with new undecoded data blocks. It is possible to replace the retiring block in memory with input data, sample by sample, as the retiring block is being read for the final time for its last SISO operation. As the retiring block is being read, and the new block is being written, the new block will be ready for its first SISO operation as soon as the final SISO operation on the retiring block is complete. For example, the last SISO operation S6 is performed on block B1 in processing unit PU2. As a result, a processing slot becomes open. New data block B7 is input to processing unit PU3 for the first SISO operation.

When data blocks have a fixed data block size, such that the data block input time to a processing unit is greater than or equal to the combination of all pipeline delays in the system, only one extra data block is required to fully utilize the processing units of the circular pipeline (i.e. 5 blocks for 4 processing units). For instance, in the example shown in FIG. 6, the data block input time is 4 times the pipeline delay, and there are only four pipeline delays in the system (1 for each processing unit). When data blocks of fixed size are input, and the data block input time is less than the total of the pipeline delay in the system, more than one additional data block may be required to be available for input in order to maintain full efficiency.

Figure 7:
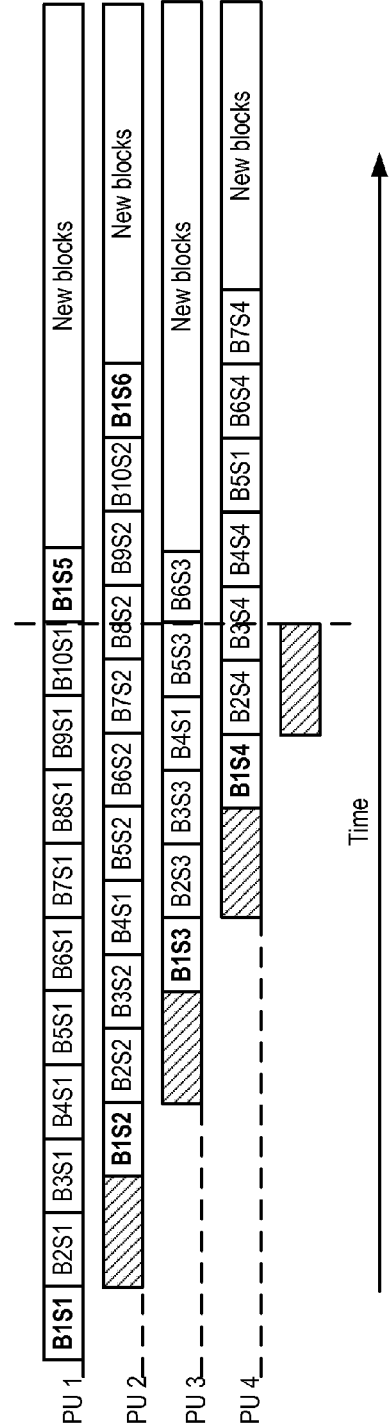
FIG. 7 illustrates another example data flow in a system having four processing units arranged in a circular pipeline.

FIG. 7 illustrates data flow in a system having four processing units arranged in a circular pipeline. Similar to the example shown in FIG. 6, each data block is processed in three decoding iterations (i.e., six SISO operations). In this example, the pipeline delay is 1.5 times the data block input time. As a result, a stream of 10 data blocks is required to fully occupy the pipeline such that no idle cycles are incurred. New blocks can be input to replace the retiring blocks as described above. The number of blocks required to achieve full utilization based on the relationship between the block size and the pipeline delay is given by:

$$\text{Num. Blks} = (\text{Num. PU}) + \text{ceiling}((\text{Num. PU} * \text{Pipeline Delay}) / \text{Data Block Input Time}).$$

It is recognized that more blocks than the minimum indicated by the formula above can be submitted to the circular pipeline for processing without affecting the ability of the pipeline to maintain full throughput efficiency.

A decoder using a circular pipeline described above may be configured to have a relatively constant input and output bandwidth. It can be observed in FIG. 6 and FIG. 7 that blocks are input and output one at a time in a sequential fashion. As a result, an input buffer may only be required to be capable of buffering a single full size block at a time.

Figure 8:
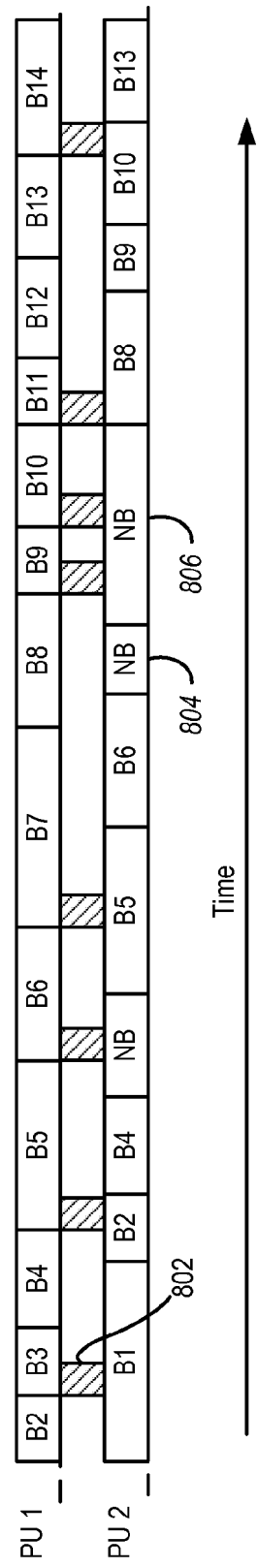
FIG. 8 illustrates an example data flow of variable sized data blocks between 2 processing units which are part of a circular pipeline.

The examples shown in FIGS. 6 and 7 illustrate data flow with data blocks having a fixed block size. In one or more embodiments, it is also possible to operate the circular pipeline at full efficiency even with variable block sizes. FIG. 8 illustrates data flow of variable sized data blocks in a circular pipeline of processing units. For ease of explanation, this example is illustrated using only two processing units of the pipeline, where the first processing unit PU1 forwards or retires blocks and the second processing unit PU2 processes the forwarded blocks or processes a new block (NB). The size of a data block available for processing on a processing unit, and thereby the data block input time, varies at any point in time based on the current and historical block sizes. The pipeline delay required to write back and transfer a data block from one processing unit to the next is indicated by hashed blocks 802. For simplicity, the lengths of the blocks in this example vary such that the data block input time varies between 2 and 6 times the length of the pipeline delay. The circular pipeline can be fully utilized with any data block size (up to the maximum data block size) as well. When the SISO operation on a data block in one processing unit has not completed but the next processing unit is ready to process another block, a new block may be input to the next processing unit to avoid the processing unit from becoming idle.

For example, decoding of data block B3 can complete on processing unit PU1 without inserting a NB on PU2 because by the time that PU2 completes processing of data blocks B1 and B2, data block B4 is available just in time for processing on processing unit PU2. In contrast, when data block B5 is processed on processing unit PU1, due to the increase in size of data block B5 it is not available when processing of data block B4 is completed on processing unit PU2. To avoid idle cycles, a new block is input to processing unit PU2 despite decoding of a block not having completed at this point. As another example, decoding of data block B7 completes on PU1 and data block B8 is not available at the time PU2 completes the SISO operation on data block B6. A NB 804 is input to PU2, but the NB 804 is small enough that processing completes before data block B8 is available from PU1. To avoid idle cycles another NB 806 is input to PU2 once the SISO operation completes on NB 804.

For variable block sizes, it is recognized that immediately scheduling and inputting available data blocks from the input buffer to the circular pipeline whenever possible, as illustrated in FIG. 6, may reduce the efficiency of the pipeline. The reason for this reduced performance is that immediately adding blocks to the pipeline may create a shortage of blocks in the input buffer so that when a processing unit becomes idle, a new block may not be available to fill the idle processing slot.

In one embodiment, the system has enough memory to store the number of data blocks needed to allow new blocks to be inserted where required to keep the processing units busy. For each input/output point in the circular pipeline, a certain amount of slack is required to accommodate changes in the block size between outgoing and incoming blocks as considered in the example. For example, in the architecture shown in FIG. 3, one input and one output port are provided for each processing stage (1 input and 1 output per set of 2 processing units). The overall memory requirement, M, to achieve full efficiency for variable block sizes is given by:

$$M = \text{(Total system pipeline delay)} + \text{((Max. block size)} * \text{(Num. PU))} + \text{((Max. block size} - \text{Min. block size)} * \text{Num. I/O ports)}$$

It is recognized that for a maximum block size of 5114 bits (the maximum sized block for HSPA+), neither the total systems pipeline delay nor the minimum block size are significant in relation to the maximum block size and can be disregarded. Disregarding pipeline delay and minimum block size, an overall memory requirement of 3, 6 and 12 full size blocks may be expected for systems having 2, 4 and 8 processing units respectively.

Profiling in the system model has shown that there is no memory penalty in supporting full efficiency with variable sized blocks over fixed sized blocks for systems having 2 and 4 processing units. Capacity for an additional maximum size block is desirable in an 8 processing unit system to accommodate the extra input/output points in the array. The memory requirements indicated above correspond to the theoretical worst case scenario. In practice, less memory may be required because the worst case situation, which will never or very seldom occur, will have a negligible effect on overall efficiency.

It is recognized that the above dataflows may be achieved using a number of different memory architectures. For example, in one or more embodiments, a block's input and working (extrinsic) data could potentially physically flow through the system from processing unit to processing unit and processing stage to process stage as SISO operations are completed. Alternatively, each processing unit can gain read/write access to a static memory location, specific to a block, in a shared memory via a crossbar switch. The later implementation is possible because SISO operations performed on a data block cannot be overlapped and only a single processing unit will ever require access to the data of a particular data block at any one time.

Figure 9:
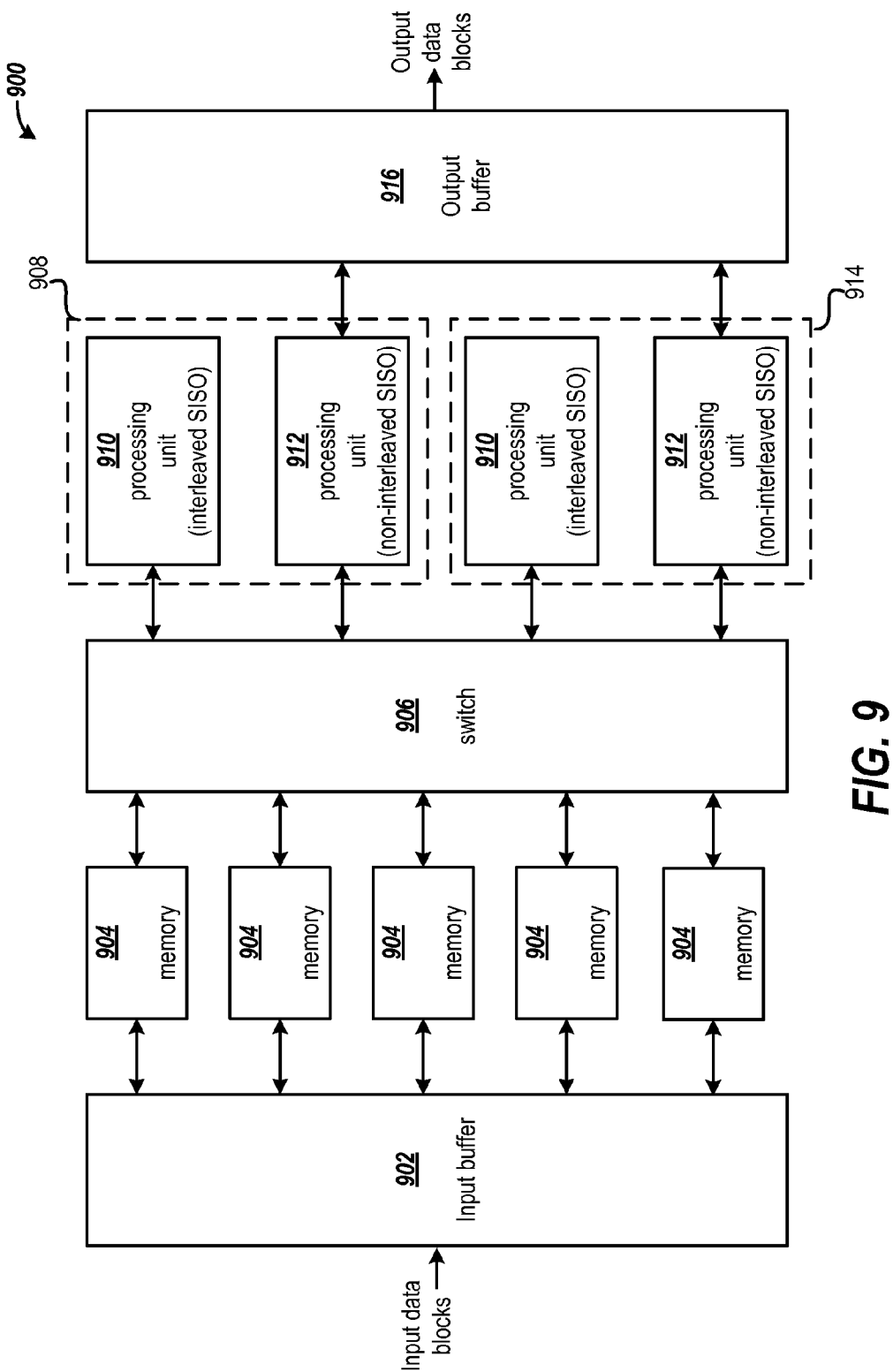
FIG. 9 shows a block diagram of the HSPA+ pipelined block processor with a centralized, shared memory architecture.
Figure 10:
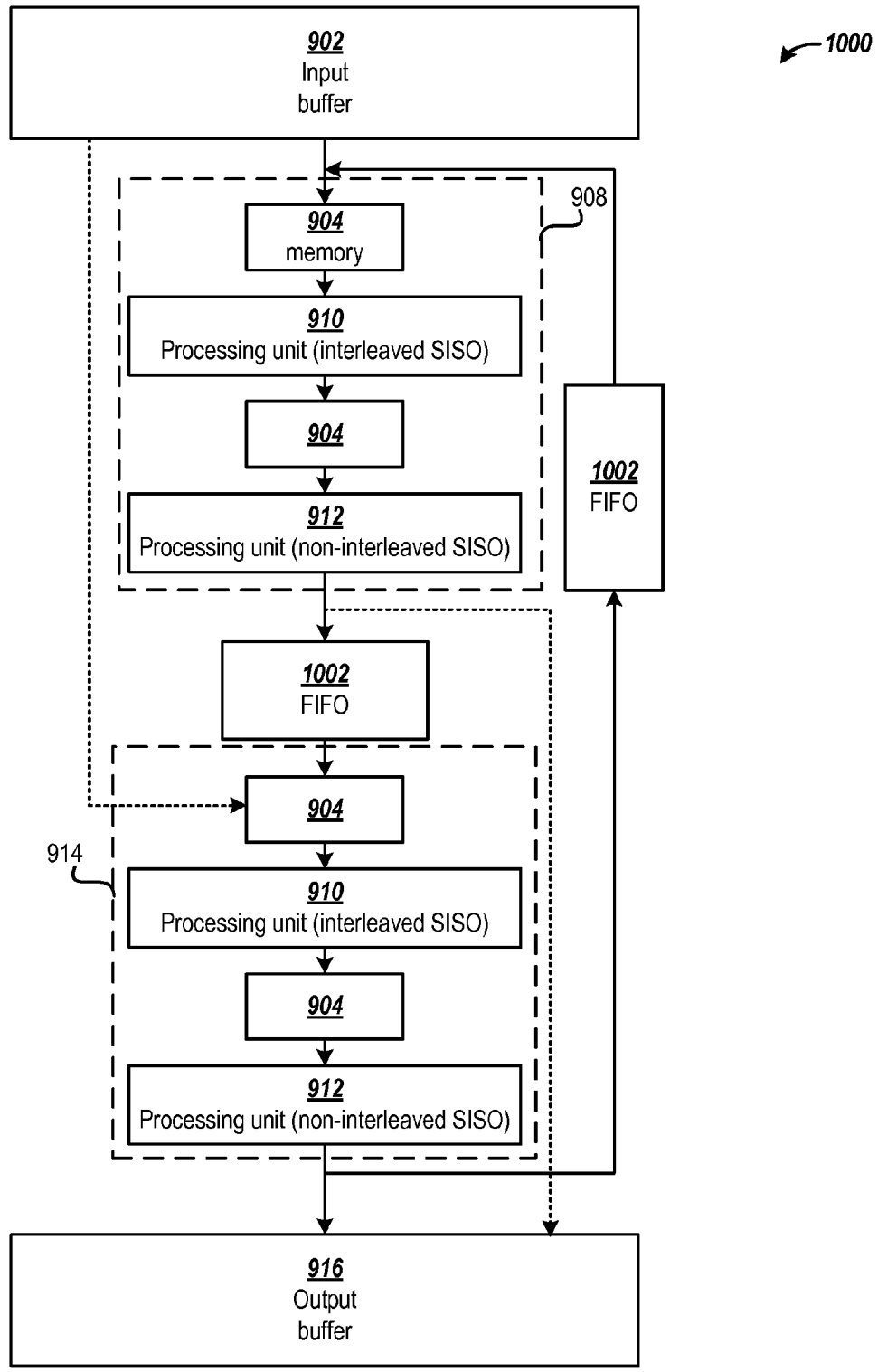
FIG. 10 shows a block diagram of the HSPA+ pipelined block processor with a distributed memory architecture.

FIGS. 9 and 10 show example circuit implementations to implement a circular pipelined decoder with centralized and decentralized memory architectures, respectively. FIG. 9 shows an example circuit implementing a circular pipelined decoder with a centralized memory architecture. The circuit includes an input buffer 902, a plurality of processing units 910 and 912, a plurality of memory units 904 for storage of data blocks during processing, and an output buffer 916. For ease of explanation, this example illustration includes two processing stages 908 and 914, each processing stage including a processing unit 910 for performing an interleaved SISO operation and a processing unit 912 for performing a non-interleaved SISO operation.

Each memory unit 904 only has enough memory to contain one maximum sized block. As described above, five full-size blocks are required to avoid idle cycles with four processing units. During operation, memory units 904 are used to store successive data blocks as they are input to the system from the input buffer 902. As described above, each input data block is processed by several processing units over several iterations. As a data block is processed in the circular pipeline, the data block does not move from one memory unit to another. Rather the processing units 910 and 912 in stages 904 and 914 access the same memory unit at different times for processing the data block. The switch 906 provides access to the data blocks in the memory units 904 for the processing units.

In one implementation, each data block may be statically stored in a specified one of the memory units 904 for the duration of the processing iterations. Each SISO operation will consist of reading the block data from the RAM, processing it within a processing unit and then writing the resulting data back to the same memory area for the next processing stage. In this implementation, the switch is configured to map the appropriate processing unit 910 and 912 to the specified memory unit 904 for each SISO operation.

In another implementation, the switch may be configured to dynamically map processing units 910 and 912 to various available memory units 904 as required during the decoding iterations. For example, the memory units may be implemented by one large block of memory, with a respective base memory address corresponding to each memory unit. A data block written into the memory may be written to the next memory location and indexed by the processing unit from which the data was produced. In such an implementation of memory, a data block may be written to different physical memory locations after various decoding iterations. These example implementations of memory units are intended for illustration and not limitation. Other various implementations of memory and addressing are envisioned as well.

In either implementation, when the processing is complete, the results are passed onto the output buffer 916. As described above, decoding of data blocks may be completed by either one of the processing stages 908 and 914 depending on the number of decoding iterations required to complete decoding. The output buffer 916 is configured to output data blocks from the correct processing stages as decoding is completed.

When a decoded data block is output, the corresponding memory unit 904 can be reloaded with a new block, assuming one is available in the input buffer 902. This new block will begin to be processed when a scheduling algorithm determines that there is an available processing slot.

In one or more other embodiments, the system may be implemented using a distributed memory architecture. FIG. 10 shows the circular pipeline decoder shown in FIG. 9 implemented with a distributed memory architecture. The distributed memory architecture includes a local memory unit per processing unit with an additional FIFO buffer following each processing stage. In this two-processing-stage example, each of the memory units 904 and the FIFO buffers 1002 is capable of storing a data block of the maximum size (e.g., 5 k) block. Therefore, the 4-processing-unit system is capable of storing 6 data blocks of the maximum size, a 2 processing unit system would provide storage for 3 blocks etc.

In operation, new blocks are input from the input buffer 902 into the first memory unit 904 of processing stage 908. The data block is processed by processing unit 910 of processing stage 908. When the interleaved SISO operation is completed, the entire set of input data and the extrinsic results from processing unit 910 are passed to the local memory unit 904 preceding processing unit 912 of processing stage 908. The non-interleaved SISO operation is then performed on the passed data by processing unit 912. When the non-interleaved SISO operation is completed by processing unit 912 of one of the processing stages, the data block and extrinsic data are buffered in the one of the FIFO buffers 1002 that follows the stage. Each data block flows through memory units in the pipeline as the SISO operations are performed.

The flow of data from one processing unit to the next is a continuous process as transferring data at the end of each operation is not optimal in terms of the resources or the time taken. On every clock cycle, a memory unit 904 will receive data from the FIFO buffer 1002 or input buffer 902 by writing the data block into the first memory unit 904 of the processing stage. Only if there is valid data in the pipeline will a processing unit perform a useful operation, otherwise that clock cycle is idle.

As data is output from one of the non-interleaved processing units in this example, the data can be passed directly to the output buffer 916 or into a FIFO buffer 1002 for further processing. Only valid data is passed to the FIFO so if the circular pipeline is not fully busy the FIFO buffer will not be full. The amount of space in the FIFO buffer can therefore be used as a measure of activity within the circular pipeline.

For example, if the FIFO buffer has 3 k words of space, a data block of up to 3 k can be read from the input buffer 902 and added to memory 904 of processing stage 908. Assuming for purposes of illustration that 1 sample is processed per cycle, it will take approximately 3 k cycles to transfer the data from the input buffer 902 to the memory. During this time period, processing unit 910 of processing stage 908 will not be processing any data from the FIFO buffer 1002 and the FIFO buffer will gradually fill up, assuming the data is valid. The FIFO buffer therefore provides a mechanism to control the number of blocks within the circular pipeline at a given time.

Figure 11:
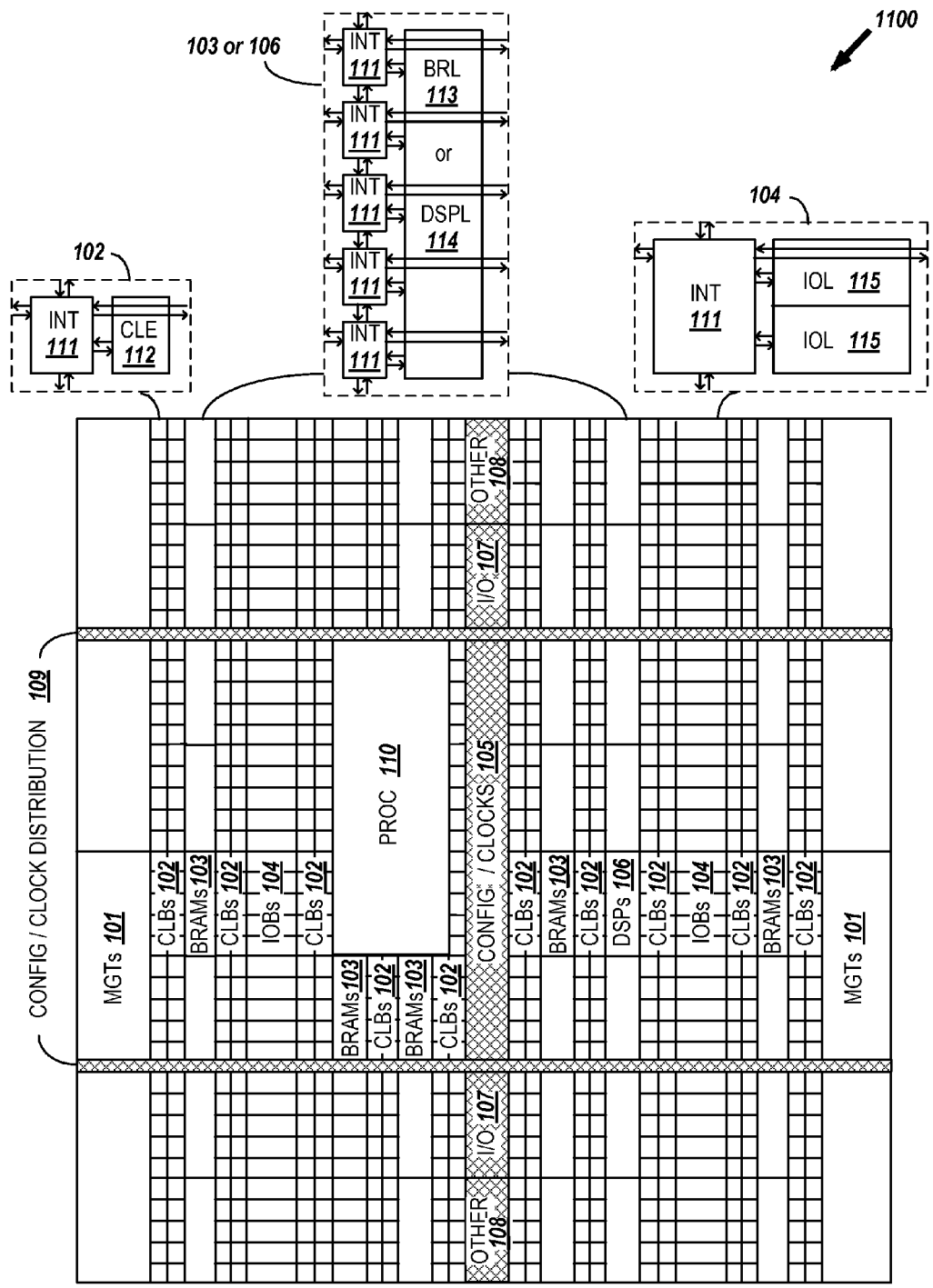
FIG. 11 shows an example FPGA architecture.

FIG. 11 shows an example programmable integrated circuit (IC) that may be configured to implement a circular pipelined processing system. The illustrated programmable IC is referred to as a Field Programmable Gate Array (FPGA). FPGAs can include several different types of programmable logic blocks in the array. For example, FIG. 11 illustrates an FPGA architecture (100) that includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (I/O) 107, for example, e.g., clock ports, and other programmable logic 108 such as digital clock managers, analog-to-digital converters, system monitoring logic, and so forth. Some FPGAs also include dedicated processor blocks (PROC) 110 and internal and external reconfiguration ports (not shown)

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA. The INT 111 also includes the connections to and from the programmable logic element within the same tile, as shown by the examples included at the top of FIG. 11.

For example, a CLB 102 can include a configurable logic element (CLE) 112 that can be programmed to implement user logic plus a single INT 111. A BRAM 103 can include a BRAM logic element (BRL) 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL) 114 in addition to an appropriate number of programmable interconnect elements. An IOB 104 can include, for example, two instances of an input/output logic element (IOL) 115 in addition to one instance of the INT 111. As will be clear to those of skill in the art, the actual I/O pads connected, for example, to the IOL 115 are manufactured using metal layered above the various illustrated logic blocks, and typically are not confined to the area of the IOL 115.

In the pictured embodiment, a columnar area near the center of the die (shown shaded in FIG. 11) is used for configuration, clock, and other control logic. Horizontal areas 109 extending from this column are used to distribute the clocks and configuration signals across the breadth of the FPGA.

Some FPGAs utilizing the architecture illustrated in FIG. 11 include additional logic blocks that disrupt the regular columnar structure making up a large part of the FPGA. The additional logic blocks can be programmable blocks and/or dedicated logic. For example, the processor block PROC 110 shown in FIG. 11 spans several columns of CLBs and BRAMs.

Note that FIG. 11 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 11 are purely exemplary. For example, in an actual FPGA more than one adjacent column of CLBs is typically included wherever the CLBs appear, to facilitate the efficient implementation of user logic.

Those skilled in the art will appreciate that various alternative computing arrangements, including one or more processors and a memory arrangement configured with program code, would be suitable for hosting the processes and data structures of the different embodiments. In addition, the processes may be provided via a variety of computer-readable storage media or delivery channels such as magnetic or optical disks or tapes, electronic storage devices, or as application services over a network.

The embodiments are thought to be applicable to a variety of systems for iterative block based data processing. Other aspects and embodiments will be apparent to those skilled in the art from consideration of the specification. The embodiments may be implemented as one or more processors configured to execute software, as an application specific integrated circuit (ASIC), or as a logic on a programmable logic IC. It is intended that the specification and illustrated embodiments be considered as examples only, with a true scope and spirit of the embodiments being indicated by the following claims.

What is claimed is:

1. A method of decoding, comprising:
   inputting a plurality of data blocks into a memory arrangement; and
   for each of the plurality of data blocks in the memory arrangement, performing a plurality of decoding iterations using a circular pipeline circuit including a plurality of processing stages, each decoding iteration including, in one processing stage of the circular pipeline circuit:
      performing a first set of soft-input-soft-output (SISO) decoding operations on a block of data from the plurality of data blocks in the memory arrangement to produce an intermediate block of data; and
      performing a second set of SISO decoding operations on the intermediate data block to complete the one decoding iteration, a next decoding iteration of the plurality of decoding iterations being performed using a next processing stage following the one processing stage of the circular pipeline circuit of processing stages, one of the first and second sets of SISO decoding operations performing interleaved decoding operations and the other of the first and second sets of SISO decoding operations performing non-interleaved decoding operations; and
   in each processing stage of the circular pipeline circuit:
      outputting a decoded data block in response to completing a final decoding iteration of the block of data, thereby making the next processing stage in the circular pipeline circuit available to process an unprocessed one of the plurality of data blocks, and otherwise storing a partially decoded data block in the memory arrangement in response to completing a non-final decoding iteration of the block of data; and
      inputting an unprocessed one of the plurality of data blocks into the processing stage in response to the previous processing stage in the circular pipeline circuit outputting a decoded data block, and otherwise, inputting the partially decoded data block, stored in the memory arrangement by a previous processing stage in the circular pipeline circuit, to the processing stage; and
   wherein each unprocessed data block of the plurality of data blocks is input to a respective one of the plurality of processing stages that is available to process the unprocessed data block.

2. The method of claim 1, wherein the first and second sets of SISO decoding operations are performed with first and second respective processing units.

3. The method of claim 2, further comprising, for each processing stage:
   writing back the intermediate block of data from the first processing unit to the memory arrangement; and
   inputting the intermediate block of data from the memory arrangement to the second processing unit after write-back of the intermediate block of data has completed.

4. The method of claim 1, wherein the plurality of data blocks have a fixed block size.

5. The method of claim 1, wherein the decoder is configured to process data blocks of variable size.

6. The method of claim 5, further comprising for each processing stage:
   in response to completing the first set of SISO decoding operations and a first partially decoded data block not being available from the preceding processing stage in the circular pipeline circuit, inputting an unprocessed one of the plurality of data blocks to the processing stage.

7. The method of claim 6, wherein upon completing the first set of SISO decoding operations on the unprocessed one or the plurality of data blocks, inputting the partially decoded data block to the processing stage.

8. A decoder, comprising:
   a memory arrangement configured for storage of a plurality of data blocks;
   a circular pipeline including a plurality of processing stages, each processing stage including:
      a first processing unit coupled to the memory arrangement and configured to perform a first set of soft-input-soft-output (SISO) decoding operations on a block of data from the plurality of data blocks in the memory arrangement to produce an intermediate block of data, and store the intermediate block of data in the memory arrangement; and
      a second processing unit coupled to the memory arrangement and configured to perform a second set of SISO decoding operations using the intermediate block of data to complete one decoding iteration; and
   wherein:
      each second processing unit in the processing stage is configured to output a decoded data block in response to completing a final processing iteration, thereby making the next processing stage in the circular pipeline circuit available to process an unprocessed one of the plurality of data blocks, and otherwise, store a partially decoded data block in the memory arrangement in response to completing a non-final decoding iteration of the block of data; and
      each first processing unit in the processing stage is configured to receive and process an unprocessed data block from the plurality of data blocks in the memory arrangement in response to a partially decoded data block from the second processing unit of the preceding processing stage in the circular pipeline not being available, wherein each unprocessed data block of the plurality of data blocks is received by a respective one of the plurality of processing stages that is available to process the unprocessed data block.

9. The decoder of claim 8, wherein:
   the first processing unit of each processing stage is configured to write-back the intermediate block of data to the memory arrangement; and
   the second processing unit of the corresponding stage is configured to retrieve the intermediate block of data from the memory arrangement after write-back of the intermediate block of data has completed.

10. The decoder of claim 8, further comprising an input buffer circuit coupled to the memory arrangement and configured to:

buffer input blocks received at an input of the decoder; and store buffered input blocks in the memory arrangement as blocks of memory become available.

11. The decoder of claim 8, further comprising an output buffer circuit configured to receive decoded data blocks from the second processing units and output the decoded data blocks from the decoder.

12. The decoder of claim 10, wherein the input buffer circuit is capable of buffering one maximum sized block of data.

13. The decoder of claim 8, wherein the decoder is configured to process variable block size data blocks.

14. The decoder of claim 13, wherein in the first processing unit of each processing stage is further configured to receive and process a new data block of the plurality of data blocks in response to the first processing unit being ready to accept a data block and a partially decoded data block not being available from the preceding processing stage in the circular pipeline of processing stages.

15. The decoder of claim 14, wherein upon completing SISO decoding operations on the new data block, the first processing unit is configured to receive and process the partially decoded data block in response to the partially decoded data block being available.

16. The decoder of claim 8, wherein the size of plurality of data blocks is fixed.

17. A system for iterative processing, comprising:
a memory arrangement configured for storage of a plurality of data blocks;
a plurality of processing stages, each processing stage configured to perform one processing iteration on a first block of data; and
wherein the plurality of processing stages is configured to operate in a circular pipeline of identical processing stages, each processing stage being configured to perform steps including:

outputting a fully processed data block in response to completing a final processing iteration, thereby making the next processing stage in the circular pipeline circuit available to process an unprocessed one of the plurality of data blocks, and otherwise, storing a partially processed data block in the memory arrangement in response to completing a non-final decoding iteration of the block of data; and receiving and processing an unprocessed one of the plurality of data blocks in response to the partially processed data block not being available, and otherwise, receiving and processing a partially processed data block from the second processing unit of the preceding processing stage in the circular pipeline, wherein each unprocessed data block of the plurality of data blocks is received by a respective one of the plurality of processing stages that is available to process the unprocessed data block.

18. The system of claim 17, further comprising an input buffer circuit coupled to the memory arrangement and configured to:
buffer data blocks received at an input of the system; and
store buffered data blocks in the memory arrangement as blocks of memory become available.

19. The system of claim 17, further comprising an output buffer circuit configured to:
receive fully processed data blocks from circular pipeline of processing stages; and
output the fully processed data blocks from the system.

20. The method of claim 1, wherein the storing of a partially decoded data block in the memory arrangement, by the processing stage of the circular pipeline circuit, includes storing a data block and a set of intrinsic data generated by the processing stage.

* * * * *